United States Patent [19]

Aberle et al.

[11] Patent Number: 4,704,654
[45] Date of Patent: Nov. 3, 1987

[54] OVER-VOLTAGE PROTECTIVE CIRCUIT FOR SEMICONDUCTOR NETWORK

[75] Inventors: Thomas Aberle, Kornwestheim; David V. Belzen, Hemmingen; Immanuel Krauter, Erbstetten, all of Fed. Rep. of Germany

[73] Assignee: Robert Bosch GmbH, Stuttgart, Fed. Rep. of Germany

[21] Appl. No.: 682,168

[22] Filed: Dec. 17, 1984

[30] Foreign Application Priority Data

Feb. 8, 1984 [DE] Fed. Rep. of Germany ....... 3404317

[51] Int. Cl.[4] .............................................. H02H 9/04
[52] U.S. Cl. ........................................ 361/90; 361/91; 361/92; 307/297; 323/316
[58] Field of Search ................ 323/315, 316; 307/297, 307/491, 200 A; 330/288; 361/88, 91, 111

[56] References Cited

U.S. PATENT DOCUMENTS

| | | | |
|---|---|---|---|
| 4,027,177 | 5/1977 | Davis | 307/237 |
| 4,268,789 | 5/1981 | Nagano | 323/315 |
| 4,350,904 | 9/1982 | Cordell | 307/310 |
| 4,496,885 | 1/1985 | Nitschke | 318/122 |

FOREIGN PATENT DOCUMENTS 3240280  3/1984  Fed. Rep. of Germany .

OTHER PUBLICATIONS

Analog Integrated Circuit Design by Alan B. Grebene Microelectronics Series, Van Nostrand Co.
Funkschau vol. 26, 1983 pp. 44–47 Versatile, but little known: "Do You Know Current Mirrors?".

Primary Examiner—A. D. Pellinen
Assistant Examiner—H. L. Williams
Attorney, Agent, or Firm—Frishauf, Holtz, Goodman & Woodward

[57] ABSTRACT

To protect electrical equipment against excessive applied input signals which, for example, may be analog signals, excessive with respect to positive or negative excess voltage in relation to an upper reference level ($U_{Ref}$) and/or a lower reference level (GND), collector current control of the transistor (12) at the input (3) of the protective circuit by three transistors (11, 13, 14) holds the voltage level at the input (3) at the reference voltage level when a driving or signal supply circuit provides an excess voltage. The input transistors, and the further transistors, are connected in the form of a current mirror. The circuit can be constructed in dual form (11–14; 21–24) to provide for protection against negative over-voltage as well. Due to the symmetrical circuit structure, excellent temperature compensation is obtained. The circuit can easily be constructed in the form of an integrated circuit.

13 Claims, 7 Drawing Figures

OVER-VOLTAGE PROTECTIVE CIRCUIT FOR SEMICONDUCTOR NETWORK

Reference to related publication, assigned to the assignee of the present application:
German Patent Disclosure Document DE-OS 32 40 280, BORST.
Literature references:
"Analog Integrated Circuit Design", by Alan B. Grebene, MICROELECTRONICS SERIES, Van Nostrand Reinhold Company, publishers.
"Funkschau", Vol. 26, 1983, pp. 44-47, "Versatile, but little known: Do you know current mirrors?" "Many interesting circuits can be built easier therewith. The principle of the current mirror has been used in the interior of many ICs for several years. What one can do with "single" current mirrors is shown in this report."

The present invention relates to a protective circuit to protect semiconductor networks against excessive voltages applied to control signal terminals, for example due to excessive levels of electrical control signals. Such control signals may, for example, be analog signals representative of sensed or measured or operating parameter values.

BACKGROUND

It has previously been proposed - see the referenced publication German Patent Disclosure Document DE-OS 32 40 280, BORST, to protect electrical networks, particularly networks including semiconductors, against excessive levels of applied analog signals or digital signals. The respective signals, whether they be analog signals or digital signals, are intended to be applied to an electrical apparatus controlled by these electrical signals. The electrical apparatus should be protected against positive and/or negative excessive levels, typically excessive voltage levels applied to the input of the electrical apparatus or network by a protective circuit. It may arise that the input resistance of the apparatus to be protected may be non-linear; non-linear input resistances cause problems. The non-linearity may be in the range of about, for example, 100 millivolts per decade of current of the input current. Additionally, the input resistance of the network or apparatus to be protected may vary with temperature, so that any measured output may be falsified due to different temperature levels from those which are expected.

Excess input signals, for example in analog or digital form, may arise, typically, in automotive apparatus in which input terminals of electrical equipment may be subjected to signal levels of abrupt or sudden change in value due, for example, to transient conditions of operation of the vehicle. For example, if the vehicle passes close by or under a high-tension transmission line, or close to the catenary system of an electric railway, stray pulses may be induced in the electrical system of the vehicle which may lead to over-voltages at the signal inputs of electronic equipment in the vehicle.

THE INVENTION

It is an object to protect electrical equipment having input terminals againt excessive signal levels applied to the signal input terminals thereof, in which the electrical apparatus may have input resistances which are non-linear with respect to current and/or temperature. Briefly, the control signals applied to the electrical apparatus, which may have an excess value with respect to a reference $U_{Ref}$, are applied to two cascaded current mirror circuits, each of which includes transistors. The current mirror circuits are connected or biassed to be conductive. The emitter of the transistors of the first current mirror is connected to a second reference, for example ground; the emitter of an output transistor of the second current mirror circuit is connected to the input of the electrical circuit element which is to be protected; the emitter of one input transistor of the second current mirror circuit is connected to be controlled by the first reference voltage, $U_{Ref}$.

The protective circuit has the advantage that the voltage range of signals which can be applied is very wide without, however, influencing current flow at the input of the apparatus to be protected. A highly linear and flat shape of the limiting lines of the characteristics is obtained at the operating point; consequently, at the limiting voltage, a sharp but temperature-independent bend will appear in the current-voltage characteristic. The circuit permits a control range of the apparatus, for example an analog/digital converter, to approach the limiting voltage is within a few tens of millivolts.

The overall protective circuit can be constructed essentially entirely of semiconductor elements, thus can be easily made in form of an integrated circuit, so that the circuit arrangement can be used widely between or with other integrated circuit components.

The protective circuit can be easily transformed into a dual structure, so that one protective circuit is provided against over-voltages with respect to an upper reference level, and another protective circuit is provided to protect against under-voltages below a second reference level. If the protective circuit is formed with discrete components, the current sources for both protective circuits can be replaced by a single common high-resistance resistor. If the circuits are made, however, in form of an integrated circuit, separate current sources require less surface area of an integrated circuit chip than a high-resistance resistor or a group of high-resistance resistors.

DRAWINGS

DETAILED DESCRIPTION

Figure 1:
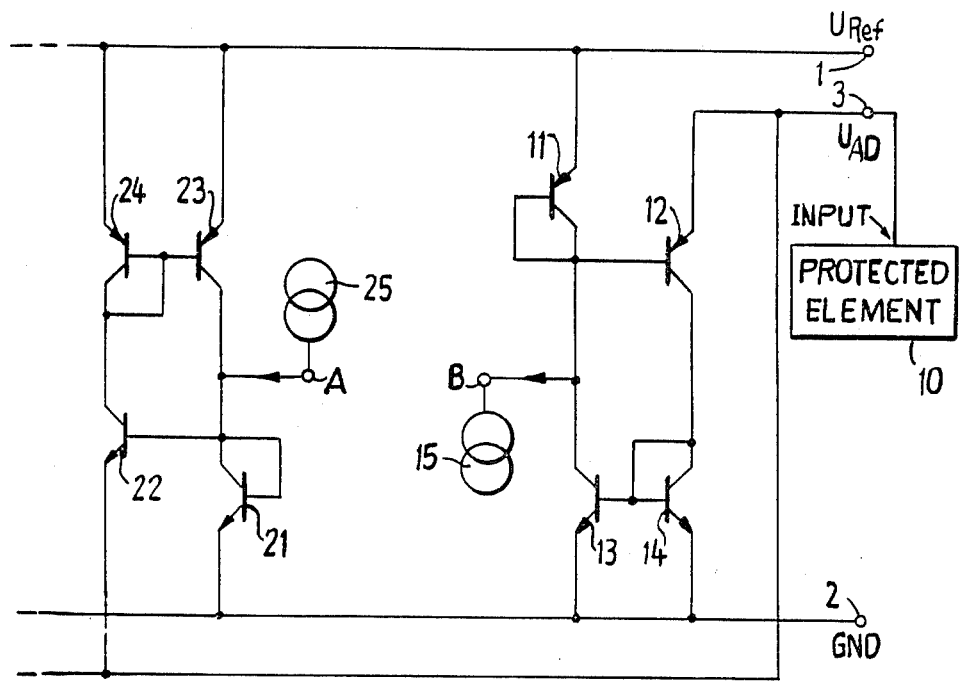
FIG. 1 is a general schematic circuit diagram of the protective circuit in accordance with the present invention, intended for connection to an input of an electrical apparatus or network controlled by electrical signals.

FIG. 1 illustrates the circuit with two reference voltages: Terminal 1 has a first reference voltage $U_{Ref}$ connected thereto; terminal 2 has a second reference voltage, for example G$_{ND}$, connected thereto. The input voltage U$_{AD}$ is applied to terminal 3. This input voltage is intended for connection to an electronic circuit, for example an analog/digital converter (not shown).

The two reference voltages U$_{Ref}$ and GND, applied to terminals 1 and 2, respectively, are also connected to the A/D converter. The embodiment illustrated in FIG. 1 includes two half-circuits. circuits. The right half, in the drawing the components 11 to 15, is provided to protect against over-voltages, that is, voltages which exceed the first reference voltage U$_{Ref}$. The left hand circuit, having the components 21, 25, is dual-symmetrical to the right circuit half, and is provided to protect against voltages applied to terminal 3 which are below the second reference voltage GND.

A first transistor 11 and a second transistor 12, both of the pnp type, have their bases connected together. The emitter of transistor 11 is connected to terminal 1, the collector and the base of transistor 11 are interconnected and, further, connected to the base of transistor 12. The emitter of transistor 12 is connected to the signal terminal 3, having the signal U$_{AD}$ applied thereto. Two npn transistors 13, 14 likewise have their bases connected together. The collector of transistor 13 is connected to the collector of transistor 11, and hence to the base of transistor 12; the collector of transistor 14 is connected to the base of the transistor 14, and hence also to the base of transistor 13. The collector of transistor 13 as well as the collector and base of transistor 11 are commonly connected to a current source 15 via a terminal B. The emitter of the transistor 14 and the emitter of the transistor 13 are, each, connected to the second reference terminal 2, having the second reference value GND connected thereto.

Overall, the circuit includes two cascaded complementary current mirrors, which are circuits well known in the electronic field and described, for example, in the publication "Funkschau", Vol. 26, 1983, pages 44 et seq. In the lower current mirror, the transistor 14 forms the input transistor, and the transistor 13 the output transistor; correspondingly, the upper current mirror has an input transistor 11, and the transistor 12 is the output transistor.

The left half of the circuit is a dual-circuit structure, which is the mirror image of the right half, in which, however, the conductivity types of the transistors, with respect to the signal input terminal 3, carrying the input signal U$_{AD}$, are reversed. Similarly, the reference voltages are, in dual manner, topologically exchanged. Otherwise, however, the protective circuit at the left half of the drawing is similar to that of the right half, and, besides the dual structure, also has a corresponding electrical operation. It is, thus, only necessary to describe the circuit structure and operation of one half of the circuit. To facilitate understanding and analysis of the circuit, the reference numerals have been so selected that the unit value of the reference numerals for similar transistors is the same, and the decade value at the right side is a 10, at the left side 20; thus, the transistor 11 at the right side has its dual in transistor 21 at the left side of the circuit of FIG. 1. Similarly, transistor 12 at the right side of the circuit has its dual in transistor 22 at the left side - and so on.

In ordinary, normal operation, that is, when U$_{ref}$ > U$_{AD}$ > GND, a quiescent current will flow through transistor 11 in the order of a few microamperes to the current source 15. This biases the base of the transistor 12. Transistors 13, 14 are blocked.

If the input voltage U$_{AD}$ approaches to within a few millivolts of the reference voltage U$_{Ref}$, transistor 12 will become conductive. Input current then will flow from terminal 3 into the transistor 12 and, hence, will form a collector current in a current mirror, formed by the transistors 13, 14. The collector current of the transistor 13 will be of the same value as that of the transistor 12. This current mirror effect causes an increase of the emitter-collector voltage on the transistor 11, so that the emitter voltage of the transistor 12, and hence the input voltage at terminal 3, cannot exceed the input voltage U$_{Ref}$ at terminal 1, independently of input current. The transistors 11, 13, 14 thus effect voltage control at terminal 3 by controlling the input current when the output voltage of a driving circuit connected to terminal 3 is higher than U$_{Ref}$. The input current in the terminal 3 is thus determined only by the output resistance of the driving circuit, e.g. supplying the signal.

The symmetrical structure of transistors 11, 12 with respect to transistors 13, 14 provides for excellent temperature compensation of the limiting level with a temperature drift of the input current of less than about 0.2 microamperes per 100° C.

Figure 2:
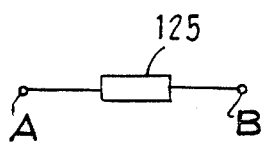
FIG. 2 is a fragmentary schematic diagram of an embodiment of a current supply circuit for the current mirror circuit.

The circuit can easily be integrated, or form part of an integrated circuit. The current sources 15, 25 then do not cause any problems. The current sources 15, 25 which may be simply transistors can, however, be replaced simply by a single high-resistance resistor in the order of magnitude of, for example, 1 meg-ohm. FIG. 2 illustrates this variation in which terminals A, B, instead of being connected to current sources 15, 25, are interconnected by a high-resistance resistor 125, connected between the collector of transistor 13 and the collector of transistor 23.

Figure 3:
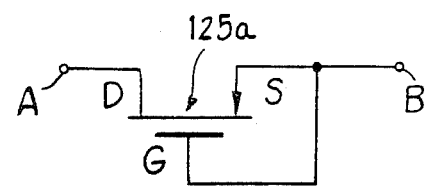
FIG. 3 is another fragmentary circuit diagram for another current supply circuit.

Such a high-resistance resistor is difficult to construct as part of an integrated circuit. As illustrated in FIG. 3, such a high-resistance resistor can be constructed in the form of a field effect transistor (FET) 125$a$, in which the terminals A, B are connected, as shown in FIG. 3.

Figure 5:
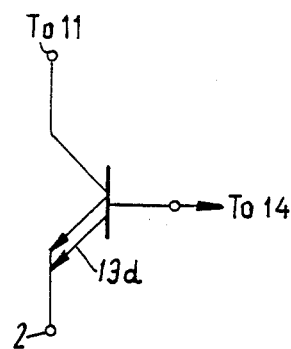
FIG. 5 is a fragmentary diagram of the circuit illustrating use of a dual-emitter transistor in the protective circuit.

The mirror factor can be changed by using transistors with multiple emitters, as illustrated, for example in the fragmentary diagram of FIG. 5, with respect to the transistor 13, shown as transistor 13$d$. The double emitters are connected together when forming current sources. This is customary connection in current source transistors and, for example, shown also in FIG. 5 of the referenced publication "Funkschau", article entitled "Do you know current mirrors?".

Figure 4:
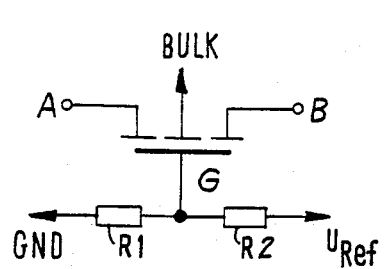
FIG. 4 illustrates another current source using a blocking layer field effect transistor, in which the gate is biassed by a voltage divider to adjust the resistance.

FIG. 4 illustrates another embodiment of a common current source obtained by a blocking layer field effect transistor, in which the gate is biassed by a voltage divider R1, R2 to adjust the resistance of the FET. The particular selection of the bias voltage depends on the operating data of the FET, and may be in accordance with any well known level, obtained from the operating data.

Figure 6:
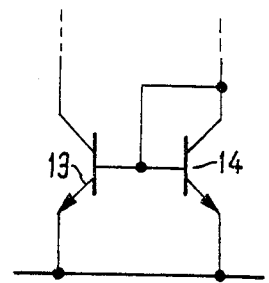
FIG. 6 illustrates, in general, the principle of the current mirror effect obtained by the surfaces of the emitters.

FIG. 6 illustrates the overall principle, in which the mirror factor is governed by the surfaces of the emitters. The surfaces of the emitters are, respectively, obtained by suitable masking of the emitter area during manufacture, for example in an integrated circuit.

Figure 7:
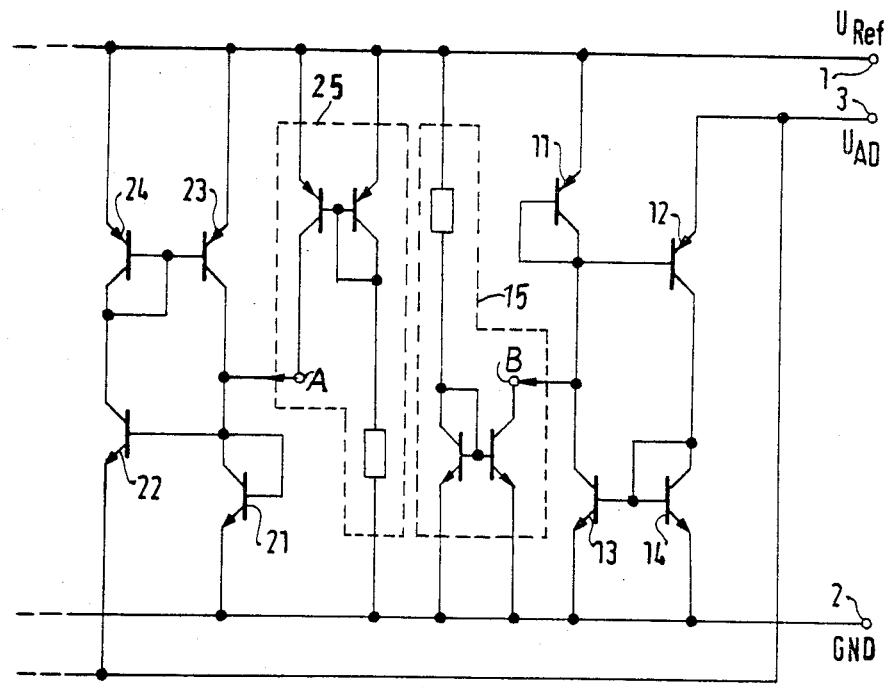
FIG. 7 illustrates the circuit of FIG. 1, in which the current sources are drawn, for example using circuits as shown in FIG. 6.

The referenced publication "Analog Integrated Circuit Design" by Alan B. Grebene (Van Nostrand, Reinhold Company "Microelectronics Series") may be resorted to, for example, for design data and design values to adapt the invention to a specific use. FIG. 7 which, in general, is identical to FIG. 1 except that the current sources 15, 25 are shown in detail, is, for example, based on current sources identical to those in the referenced "Analog Integrated Circuit Design" handbook, subheading "Diode-Biased Current-Sink", pages 114, 115 et seq., see specifically FIG. 4.2 of this literature reference.

The mirror factor of multiple emitter transistors, for example the transistor 13d, can also be changed by not connecting the two emitters in parallel, as shown in FIG. 5, but, rather by connecting only one of the emitters to terminal 2 or ground and connecting the other emitter to ground through a resistor, or by connecting the other emitter to a voltage level within the circuit which differs from that of ground or reference potential at terminal 2.

The limiting frequency of operation of the protective circuit can be increased by using high-speed transistor structures, particularly high-speed pnp transistors, where such transistors are indicated and shown in FIG. 1, for example.

I claim:

1. Protective circuit to protect an electrical circuit element (10) having control signals ($U_{AD}$) applied to an input terminal (3) thereof, against positive overvoltages of the control signals with respect to a first reference voltage ($U_{Ref}$), comprising, in accordance with the invention, a first (14, 13) current mirror circuit including an npn input transistor (14) and an npn output transistor (13), and a second current mirror circuit (11, 12) including a pnp input transistor (11) and a pnp output transistor (12), the collector terminal of each of the input transistors (11, 14) of the two current mirror circuits being connected to its own respective base, the base of the input transistor (14, 11) of each current mirror circuit being connected to the base of the respective output transistor (13, 12) thereof;

the collector of the npn input transistor (14) of the first current mirror circuit (14, 13) being connected to the collector of the pnp output transistor (12) of the second current mirror circuit (11, 12) and the collector of the npn output transistor (13) of the first current mirror circuit (14, 13) being connected to the collector of the pnp input transistor (11) of the second current mirror circuit (11, 12);

means (15) coupled to the current mirror circuits for rendering the transistors (11, 12, 13, 14) of the current mirror circuits (14, 13; 11, 12) conductive; and wherein the emitters of the transistors (13, 14) of the first current mirror circuit (13, 14) are connected to a second reference voltage (GND);

the emitter of the output transistor (12) of the second current mirror circuit (11, 12) is connected to the input terminal (3) of the electrical circuit element (10); and the emitter of the input transistor (11) of the second current mirror circuit (11, 12) is connected to and controlled by the first reference voltage ($U_{Ref}$).

2. Circuit according to claim 1, wherein
the means (15) coupled to the current mirror circuits (14, 13; 11, 12) for rendering the transistors of the current mirror circuits conductive comprises a current source connected to the collector of the pnp input transistor (11) of the second current mirror circuit (11, 12).

3. Circuit according to claim 1, wherein the current mirror transistors include at least one transistor (13d) having multiple emitters.

4. Circuit according to claim 1, wherein the protective circuit comprises an integrated circuit.

5. Protective circuit to protect an electrical circuit element (10) having control signals ($U_{AD}$) applied thereto, against excess voltage of the control signals with respect to a first reference voltage ($U_{Ref}$), wherein a first protective circuit is provided, protecting the electrical circuit element against positive overvoltages with respect to the first reference voltage ($U_{Ref}$) and comprising, in accordance with the invention, two cascaded current mirror circuits, each including two transistors (11, 12, 13, 14; 21, 22, 23, 24);

means (15, 25; 125, 125a) coupled to the current mirror circuits for rendering the transistors of the current mirror circuits conductive; and wherein the emitters of the transistors of the first current mirror (13, 14) are connected to a second reference voltage (GND);

the emitter of an output transistor (12) of the second current mirror (11, 12) being connected to one input of the electrical circuit element (2, 3); and the emitter of an input transistor (11) of the second current mirror (11, 12) is connected to and controlled by the first reference voltage ($U_{Ref}$), and a second protective circuit is provided, dual to said first protective circuit, and similarly including transistors (21, 22, 23, 24) protecting against negative over-voltages with respect to the second reference voltage (GND); and wherein the first and second protective circuits are connected in parallel, the second protective circuit having the emitters of the transistors of the first current mirror (23, 24) connected to the first reference voltage, and the emitter of the input transistor (21) of the second current mirror (21, 22) connected to and controlled by the second reference voltage.

6. Circuit according to claim 5, wherein
the collectors of the input transistors (11, 21) of the second current mirrors (11, 12; 21, 22) are connected to current sources (15; 25) forming part of the means for rendering the current mirror circuits conductive.

7. Circuit according to claim 5, wherein the current mirror transistors include at least one transistor (12a) having multiple emitters.

8. Circuit according to claim 5, wherein the protective circuit comprises an integrated circuit.

9. Circuit according to claim 6, wherein
the two current sources (15, 25) comprises a single high-resistance resistor (125).

10. Circuit according to claim 6, wherein
the two current sources (15, 25) comprise a semiconductor (125a).

11. Circuit according to claim 10, wherein said semiconductor (125a) comprises a field effect transistor.

12. Protective circuit to protect an electrical circuit element (10) having control signals ($U_{AD}$) applied to an input terminal (3) thereof, against negative overvoltages of the control signals with respect to a first reference voltage (GND), comprising, in accordance with the invention, a first current mirror circuit (24, 23) including a pnp input transistor (24) and a pnp output transistor (23) and a second current mirror circuit (21, 22) including an npn input transistor (21) and an npn output transistor (22), the collector terminal of each of the input transistors (24, 21) of the two current mirror circuits being connected to its own respective base, the base of the input transistor (24, 21) of each current mirror circuit being connected to the base of the respective output transistor (23, 22) thereof;

the collector of the pnp input transistor (24) of the first current mirror circuit (24, 23) being connected to the collector of the npn output transistor (22) of the second current mirror circuit (21, 22) and the collector of the pnp output transistor (23) of the first current mirror circuit (24, 23) being connected to the collector of the npn input transistor (21) of the second current mirror circuit (21, 22);

means (25) coupled to the current mirror circuits for rendering the transistors (21, 22, 23, 24) of the current mirror circuits (24, 23; 21, 22) conductive; and wherein the emitters of the transistors (23, 24) of the first current mirror circuit (24, 23) are connected to a second reference voltage ($U_{Ref}$);

the emitter of the output transistor (22) of the second current mirror circuit (21, 22) is connected to the input terminal (3) of the electrical circuit element (10); and the emitter of the input transistor (21) of the second current mirror circuit (21, 22) is connected to and controlled by the first reference voltage (GND).

13. Circuits according to claim 12, wherein the means (25) coupled to the current mirror circuits (24, 23; 21, 22) for rendering the transistors of the current mirror circuits conductive comprises a current source connected to the collector of the npn input transistor (21) of the second current mirror circuit (21, 22).

* * * * *